United States Patent

Chen et al.

[11] Patent Number: 6,140,227
[45] Date of Patent: Oct. 31, 2000

[54] METHOD OF FABRICATING A GLUE LAYER OF CONTACT/VIA

[75] Inventors: Coming Chen, Taoyuan Hsien; Water Lur, Taipei, both of Taiwan

[73] Assignee: United Microelectronics Corp., Hsinchu, Taiwan

[21] Appl. No.: 09/200,514

[22] Filed: Nov. 25, 1998

[51] Int. Cl.[7] .............................................. H01L 21/4763

[52] U.S. Cl. .......................... 438/644; 438/644; 438/666; 438/672; 438/669; 437/190; 437/192; 437/194; 437/195

[58] Field of Search ..................................... 437/190, 192, 437/194, 195; 438/637, 666, 669, 672; 427/248, 255, 192, 585

[56] References Cited

U.S. PATENT DOCUMENTS

| | | | |
|---|---|---|---|
| 5,534,462 | 7/1996 | Fiordalice et al. | 437/190 |
| 5,874,356 | 2/1999 | Chen et al. | 438/637 |
| 5,899,741 | 5/1999 | Tseng et al. | 438/649 |
| 5,958,508 | 9/1999 | Adetutu et al. | 427/248 |

*Primary Examiner*—David Nelms
*Assistant Examiner*—Phuc Dang
*Attorney, Agent, or Firm*—J. C. Patents; Jiawei Huang

[57] ABSTRACT

A method of fabricating a glue layer of a contact/via. A substrate is provided and a contact/via opening is formed within a dielectric layer on the substrate to expose the substrate. A glue layer is formed to cover the contact/via opening and conformal the structure. An RF sputtering process is performed on the substrate to remove an overhang structure on the upper corner of the glue layer while it is formed. A conductive layer is then formed in the contact/via opening to electrically connect to the substrate.

12 Claims, 2 Drawing Sheets

METHOD OF FABRICATING A GLUE LAYER OF CONTACT/VIA

BACKGROUND OF THE INVENTION

1. Field of the Invention

The invention relates to a method of fabricating a glue layer of a contact/via, and more particularly to a method of fabricating a glue layer of a contact/via without an overhang structure on the upper corner of the contact/via.

2. Description of the Related Art

Currently, semiconductor devices are widely involved in many products and services in our daily life. All these semiconductor devices are fabricated on a wafer through many processes, such as photolithography, deposition, ion implantation, or etching, to form an integrated circuit (IC) device. One wafer usually includes a large number of IC devices.

In semiconductor fabrication on a wafer, or on a substrate, an opening with a high aspect ratio, which is defined as a ratio of the depth to the width, is needed in some situations. The opening, such as a via opening or a contact opening, is formed in a dielectric layer and is filled with a metallic material, such as tungsten, to form a metal plug. The dielectric layer is usually sandwiched between two metal layers or between one metal layer on the top and the substrate on the bottom. The purpose of the metal plug is to interconnect these two metal layers or the upper metal layer and the substrate to achieve an interconnection between device elements. Since the material properties of the meal plug and the dielectric layer are different, there is usually a poor adhesion between the metal plug and the dielectric layer. In order to improve the adhesion between the metal plug and the dielectric layer, a conformal glue layer/barrier layer, is usually formed over the opening before the metal plug is filled in the opening. The glue layer can improve adhesion between the metal plug and the dielectric layer.

Currently, the glue layer typically includes a layer of titanium and titanium nitride as shown in FIG. 1A and FIG. 1B, which are cross-sectional views, illustrating a fabrication process of an conventional opening plug. In FIG. 1A, a dielectric layer 102 is formed on a substrate 100. An opening 104 is formed in the dielectric layer 102. A titanium layer 106 is formed over the substrate 100 by physical vapor deposition (PVD) and a titanium nitride layer 108 is formed over the titanium layer 106 by chemical vapor deposition (CVD). The titanium layer 106 and the titanium nitride layer 108 are formed together as a glue layer, which is conformal to the substrate 100. Since a high integration IC device is desired, the aspect ratio of the opening is usually high, which degrades the step coverage performance. The titanium layer 106 formed by PVD may have an overhang 106a on upper corner 102a of the opening 104.

In FIG. 1B, a tungsten metal layer 110 is formed over the substrate 100 to fill the opening 104 shown in FIG. 1A. The formation of the overhang 106a worsens the step coverage performance. A void 112 is formed within the metal layer 110 filling the opening 104. The void 112 can induce some problems, such as fracture of the metal layer 110 or high resistance of the metal layer 110, and cause a failure of the device.

SUMMARY OF THE INVENTION

It is therefore an object of the invention to provide a method of fabricating a glue layer of a contact/via, which includes the glue layer without an overhang structure on an upper corner of the contact/via opening. A void inside the opening plug is effectively avoided.

It is another an objective of the present invention to provide a method of fabricating a glue layer of a contact/via. An overhang structure of the glue layer on the upper corner of the contact/via opening is removed so as to improve step coverage performance for a high aspect ratio opening.

To achieve these objects and advantages, and in accordance with the purpose of the invention, as embodied and broadly described herein, the invention is directed towards a method of fabricating a glue layer of a contact/via. A substrate having device structure is provided and a contact/via opening within a dielectric layer is formed to expose the substrate. A glue layer is formed to cover the contact/via opening and conformal the structure. An RF sputtering process is performed on the substrate to remove an overhang structure on the upper corner of the glue layer while it is formed. A conductive layer is then formed in the contact/via opening to electrically connect to the substrate.

It is to be understood that both the foregoing general description and the following detailed description are exemplary and explanatory only and are not restrictive of the invention, as claimed.

DESCRIPTION OF THE PREFERRED EMBODIMENTS

A glue layer can improve adhesion between metal plug and dielectric. In order to further improve ohmic contact, a conformal metal layer is also included in the glue layer. So a glue layer is typically comprises titanium/titanium-nitride. In the conventional process, the titanium layer is formed by physical vapor deposition (PVD). If the width of an opening is reduced, an overhang structure may very possibly occur on the upper corner of the opening and may causes a void inside a metal plug that subsequently fills the opening. The void can degrades device performance or even causes device failure.

In order to effectively prevent the void from occurring, the invention includes a radio-frequency (RF) sputtering process after forming the titanium layer to remove the overhang structure. This ensures a better step coverage performance so that a void in plug can be effectively avoided.

Figure 2A:
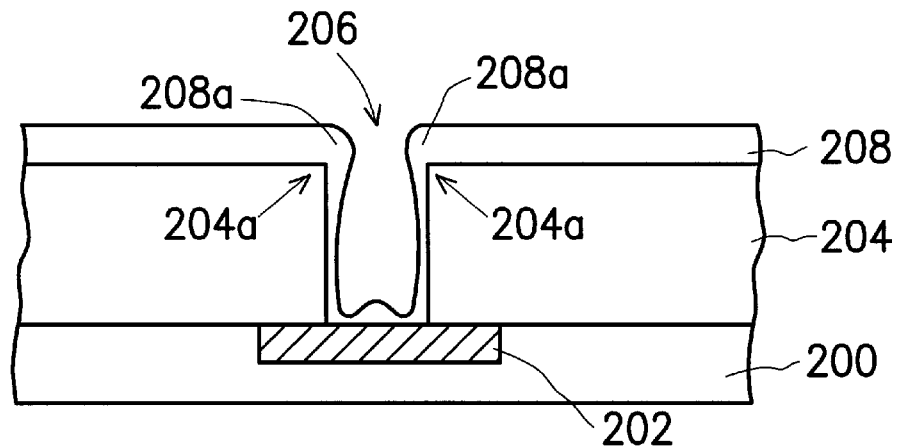
FIGS. 2A–2C are cross-sectional views, schematically illustrating a fabrication process of a glue layer without overhang structure on the upper corner of a via opening, according to a preferred embodiment of the invention.
Figure 2B:
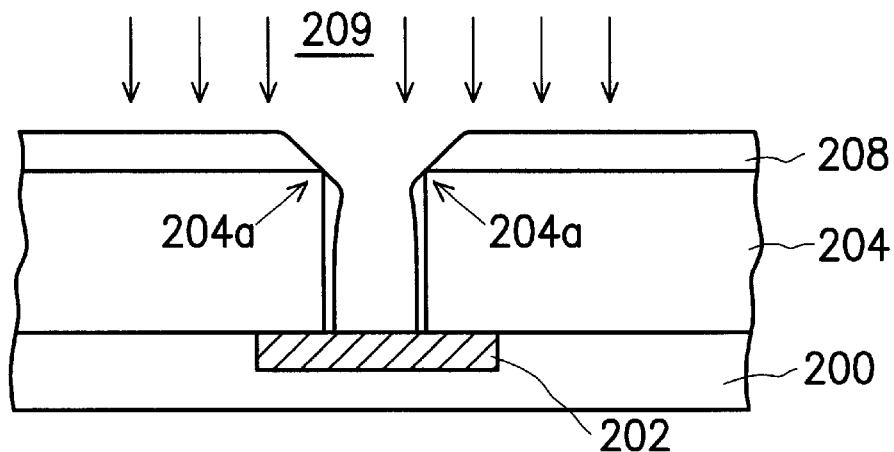
Figure 2C:
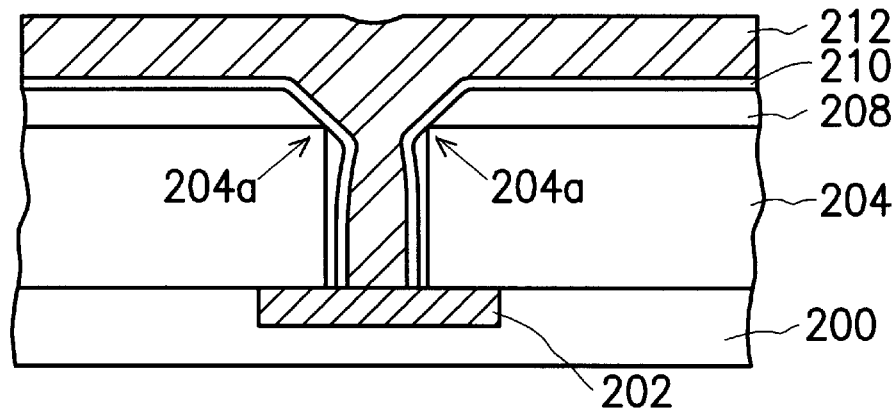

FIGS. 2A–2C are cross-sectional, schematic views illustrating a fabrication process of a plug without overhang structure, according to a preferred embodiment of the invention. In FIG. 2A, the process starts from a substrate 200, which has some device structures (not shown) been fabricated. For example, a metallic structure 202 is formed in the substrate 200. A dielectric layer 204 is formed over the substrate 200. An opening 206 exposing the metallic structure 202 is formed in the dielectric layer 204 by, for example, photolithography and etching. A glue/barrier layer 208 conformal to the substrate 200 is formed to cover a surface of the opening. The glue layer 208 includes, for example, titanium formed by PVD. The opening 206 may has a high aspect ratio in this embodiment, therefore, the width of the opening is relative small compared to the depth thereof. An overhang structure 208a is often formed on an upper corner 204a of the opening 206. The overhang structure 208a may degrade the step coverage performance for the subsequent process for a formation of a plug.

In FIG. 2B, a RF sputtering process is performed to remove the overhang structure 208a of FIG. 2A. The RF sputtering process includes flushing a gas, such as a nitrogen gas, into a reaction chamber. An RF power source is used to ionize the gas into ions 209. A voltage is applied to produce an electric field, which energizes ions 209. The ions are thus accelerated in order to bombard the substrate 200. The overhang structure 208a of FIG. 2A is removed. In addition, a portion of the glue layer 208 at the bottom of the opening 206 of FIG. 2A is also removed to expose the metallic structure 202 again. A portion of the glue layer 208 is remained because the electric field to accelerate the ions for bombardment is not high enough to remove the entire glue layer 208.

Figure 1A:
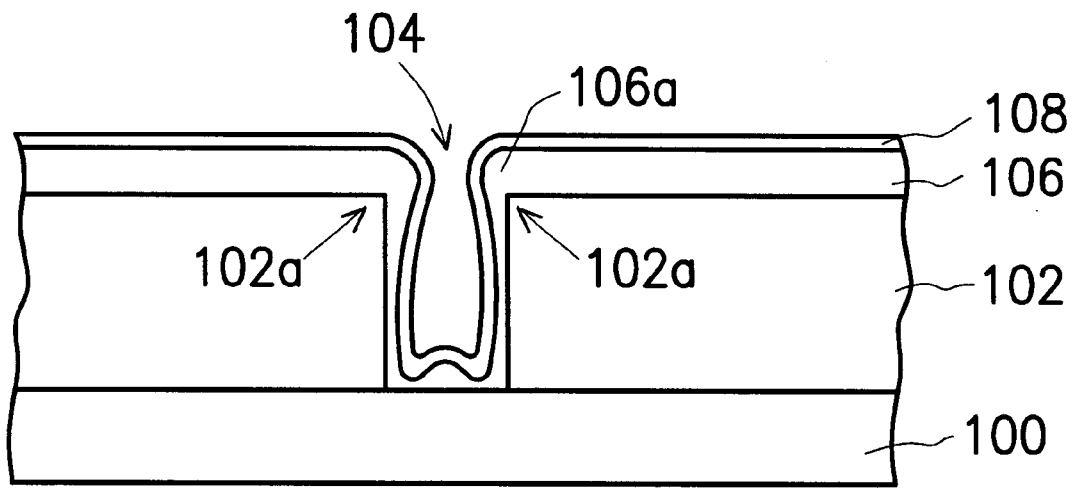
FIG. 1A and FIG. 1B are cross-sectional views, illustrating a fabrication process of a conventional via.
Figure 1B:
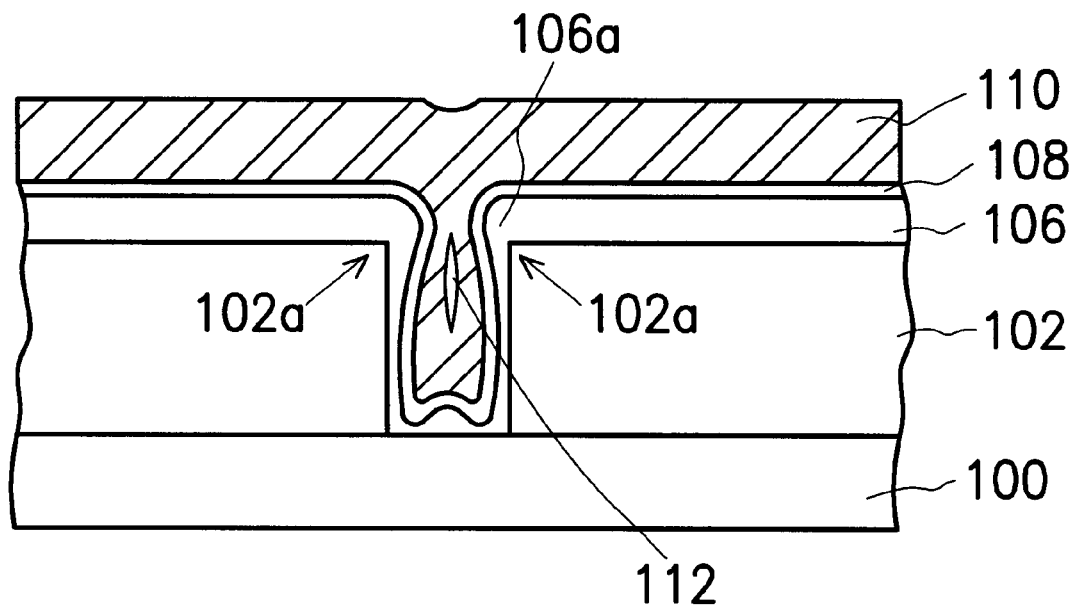

In FIG. 2C, a conformal glue layer 210 including, for example, titanium nitride is formed over the substrate 200. The formation of the glue layer 210 includes chemical vapor deposition (CVD). Since the CVD process has a better step coverage than PVD process, the glue layer 210 has no overhang structure and is conformal to the profile of the substrate 200 with a sufficiently uniform thickness. A conductive layer 212 then is deposited over the substrate 200 to at least fill the opening 206 of FIG. 2A. The conductive layer 212 includes, for example, tungsten. There is no void like the void 112 of FIG. 1B inside the conductive layer within the opening. The subsequent fabrication processes to form a plug are well known by those skilled in the art and are not further described here.

The method described above to form the glue layer 208 is suitable for any kind of opening, such as via opening, contact opening, or damascene opening. These kinds of openings each needs to contact with the dielectric layer and the subsequently formed metal layer (plug), so that it is necessary to form glue layer between the dielectric layer and the metal layer. The avoidance of the overhang structure of the glue layer on the upper corner of the opening improves the step coverage performance so that device performance can be maintained as desired by an IC design. A yield can be effectively increased.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a glue layer of a contact wherein a substrate is provided and a contact opening is formed within a dielectric layer on the substrate to expose a portion of the substrate, the method comprising:

forming a conformal glue/barrier layer to cover a side wall of the contact opening and the exposed portion of the substrate;

after forming the conformal glue/barrier layer, performing an RF sputtering process to at least partially remove an overhang structure of the glue/barrier layer at an upper corner of the contact opening; and filling the contact opening with a metal layer.

2. The method according to claim 1, wherein the glue layer includes titanium.

3. The method according to claim 2, wherein the titanium is formed by physical vapor deposition.

4. A method of fabricating a glue layer, comprising:

providing a substrate having a metallic structure;

forming a dielectric layer on the substrate;

forming an opening penetrating through the dielectric layer to expose the metallic structure;

forming a first conformal glue layer to cover a side wall of the opening, so that an over hang is formed at an upper corner of the opening;

removing the overhang by performing an RF sputtering;

forming a second conformal glue layer to cover the first conformal glue layer; and forming a metal plug to electrically connect to the metallic structure.

5. The method according to claim 4, wherein the first glue layer includes titanium.

6. The method according to claim 5, wherein the titanium is formed by physical vapor deposition.

7. The method according to claim 4, wherein the second glue layer includes titanium nitride.

8. The method according to claim 7, wherein the titanium nitride is formed by vapor deposition.

9. A method of forming a contact plug comprising:

providing a substrate having a metallic structure;

forming a dielectric layer on the substrate;

forming a contact opening in the dielectric layer exposing the metallic structure;

forming a conformal glue layer in the contact opening;

removing an overhang structure of the glue layer at an upper corner of the contact opening and a portion of the glue layer at a bottom of the contact opening; and filling the contact opening with a metal layer.

10. The method according to claim 9, wherein removing the overhang structure and the portion of the glue layer at a bottom of the contact opening includes performing a RF sputtering process.

11. The method according to claim 9, wherein the glue layer includes a titanium/titanium nitride layer.

12. A method of fabricating a glue layer of a contact wherein a substrate is provided and a contact opening is formed within a dielectric layer on the substrate to expose a portion of the substrate, the method comprising:

forming a conformal glue/barrier layer to cover the contact opening surface;

performing an RF sputtering process; and filling the contact opening with a metal layer, wherein the glue/barrier layer includes titanium formed by physical vapor deposition.

* * * * *